(12) United States Patent
Sun et al.

(10) Patent No.: US 12,178,062 B2
(45) Date of Patent: Dec. 24, 2024

(54) OLED DISPLAY SUBSTRATE AND DISPLAY APPARATUS

(71) Applicant: BOE Technology Group Co., Ltd., Beijing (CN)

(72) Inventors: Haiyan Sun, Beijing (CN); Meishan Xu, Beijing (CN); Xiaojin Zhang, Beijing (CN); Changho Lee, Beijing (CN); Dan Wang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 863 days.

(21) Appl. No.: 17/260,563

(22) PCT Filed: Apr. 9, 2020

(86) PCT No.: PCT/CN2020/084048
§ 371 (c)(1),
(2) Date: Jan. 15, 2021

(87) PCT Pub. No.: WO2021/203382
PCT Pub. Date: Oct. 14, 2021

(65) Prior Publication Data
US 2022/0190272 A1    Jun. 16, 2022

(51) Int. Cl.
*H10K 50/13* (2023.01)
*H10K 50/11* (2023.01)
(Continued)

(52) U.S. Cl.
CPC ............ *H10K 50/13* (2023.02); *H10K 50/11* (2023.02); *H10K 50/15* (2023.02); *H10K 50/16* (2023.02);
(Continued)

(58) Field of Classification Search
CPC .............................. H10K 50/13; H10K 59/352
See application file for complete search history.

(56) References Cited

U.S. PATENT DOCUMENTS

2012/0261652 A1* 10/2012 Rothe .................... H10K 71/30
                                                        438/47
2014/0217367 A1*  8/2014 Song ...................... H10K 50/14
                                                        438/46
(Continued)

FOREIGN PATENT DOCUMENTS

CN       104966787 A    10/2015
CN       108598134 A     9/2018
(Continued)

*Primary Examiner* — Michele Fan
(74) *Attorney, Agent, or Firm* — Ling Wu; Stephen Yang; Ling and Yang Intellectual Property

(57) ABSTRACT

An OLED display substrate includes a base substrate with a display region arranged thereon. First, second and third sub-pixels are arranged in the display region. A first electrode layer, a pixel defining layer, a second electrode layer, and organic functional layers are arranged in the display region. The organic functional layers include first, second and third light-emitting layers. The first light-emitting layer covers the display region and is an integral structure. The second and third light-emitting layers are arranged on a side of the first light-emitting layer towards the second electrode layer. An orthographic projection of each sub light-emitting layer of the second and third light-emitting layers on the base substrate completely covers an orthographic projection of an opening of the pixel defining layer on the base substrate, and does not overlap with orthographic projections of other openings of the pixel defining layer on the base substrate.

16 Claims, 3 Drawing Sheets

(51) Int. Cl.
*H10K 50/15* (2023.01)
*H10K 50/16* (2023.01)
*H10K 50/17* (2023.01)
*H10K 50/18* (2023.01)
*H10K 59/122* (2023.01)
*H10K 101/30* (2023.01)
*H10K 101/40* (2023.01)

(52) U.S. Cl.
CPC ........... *H10K 50/17* (2023.02); *H10K 50/171* (2023.02); *H10K 50/18* (2023.02); *H10K 59/122* (2023.02); H10K 2101/30 (2023.02); H10K 2101/40 (2023.02)

(56) References Cited

U.S. PATENT DOCUMENTS

| | | | |
|---|---|---|---|
| 2017/0186822 A1 | 6/2017 | Lai et al. | |
| 2018/0076394 A1* | 3/2018 | Kawakami | H10K 50/156 |
| 2019/0179591 A1* | 6/2019 | Kuo | G06F 3/1446 |
| 2019/0305054 A1 | 10/2019 | Tsukamoto et al. | |
| 2019/0372060 A1 | 12/2019 | Li et al. | |

FOREIGN PATENT DOCUMENTS

| | | | | |
|---|---|---|---|---|
| CN | 208157411 U | * | 11/2018 | .......... H01L 27/3211 |
| CN | 109791998 A | | 5/2019 | |
| CN | 110335953 A | | 10/2019 | |
| JP | 2011-48962 A | | 3/2011 | |
| KR | 10-2014-0104248 A | | 8/2014 | |

* cited by examiner

OLED DISPLAY SUBSTRATE AND DISPLAY APPARATUS

CROSS-REFERENCE TO RELATED APPLICATION

The present application is a U.S. National Phase Entry of International Application No. PCT/CN2020/084048 having an international filing date of Apr. 9, 2020, which is incorporated into this application by reference in its entirety.

TECHNICAL FIELD

Embodiments of the present application relate to, but are not limited to, the field of display technology, in particular to an OLED display substrate and a display apparatus.

BACKGROUND

A solution of red, green and blue sub-pixels, or a solution of white OLED plus color film is mainly used in some Organic Light Emitting Diode (OLED) display substrates. The solution of red, green and blue sub-pixels is different from the solution of white OLED plus color film, and needs to use a fine mask (FMM) in the process of thin film vapor deposition since preparation of each of red, green and blue sub-pixels are involved. However, the fine mask (FMM) used is expensive. In addition, during the use of FMM, precise alignment of the mechanism is required, and requirements for process equipment are higher, various resulting defects are prone to occur, thereby increasing the manufacturing cost.

SUMMARY

The following is a summary of subject matters described in detail herein. This summary is not intended to limit the protection scope of the claims.

An embodiment of the present application provides an OLED display substrate including a base substrate with a display region arranged thereon. First, second and third sub-pixels for respectively displaying different colors are arranged in the display region. A first electrode layer, a pixel defining layer, a second electrode layer and organic functional layers between the first electrode layer and the second electrode layer are arranged in the display region. The first electrode layer includes a plurality of first electrodes respectively arranged in the first, the second and the third sub-pixels. The pixel defining layer is arranged on the first electrode layer, and is provided with first, second and third openings for respectively defining the first, second and third sub-pixels. Surfaces of the first electrodes in the sub-pixels respectively defined by the first, second and third openings towards the second electrode layer are exposed from the first, second and third openings. The organic functional layers include first, second and third light-emitting layers. The first light-emitting layer covers the display region and is an integral structure. The second and third light-emitting layers are arranged on a side of the first light-emitting layer towards the second electrode layer. The second light-emitting layer includes a plurality of second sub light-emitting layers. An orthographic projection of the second sub light-emitting layers on the base substrate completely covers an orthographic projection of the second opening on the base substrate, and does not overlap with orthographic projections of the first and third openings on the base substrate. The third light-emitting layer includes a plurality of third sub light-emitting layers. An orthographic projection of the third sub light-emitting layers on the base substrate completely covers an orthographic projection of the third opening on the base substrate, and does not overlap with orthographic projections of the first and second openings on the base substrate.

Other aspects will become apparent upon reading and understanding the accompanying drawings and the detailed description.

BRIEF DESCRIPTION OF DRAWINGS

The accompanying drawings are used to provide an understanding of embodiments of the present application, form a part of the specification, and explain technical solutions of the present application together with embodiments of the present application, but do not constitute a limitation on the technical solutions of the present application.

THE REFERENCE SIGNS

01—first electrode layer; 02—hole injection layer; 03—hole transport layer; 04—first light-emitting layer; 05—second light-emitting layer; 06—third light-emitting layer; 07—hole blocking layer; 08—electron transport layer; 09—electron injection layer; 010—second electrode layer; 011—encapsulation layer;
1—first electrode layer; 2—first hole injection layer; 3—first hole transport layer; 4—first blocking layer; 5—first light-emitting layer; 6—second hole injection layer; 7—second blocking layer; 8—second light-emitting layer; 9—third hole injection layer; 10—third hole transport layer; 11—third blocking layer; 12—third light-emitting layer; 13—hole blocking layer; 14—electron transport layer; 15—electron injection layer; 16—second electrode layer; 17—capping layer; 18—encapsulation layer; 19—base substrate; 20—driving structural layer; 21—pixel defining layer; 22—first structural layer; 23—second structural layer; 24—third structural layer;
25—display region; 26—pixel unit;
A—first sub-pixel; B—second sub-pixel; C—third sub-pixel; D—fourth sub-pixel.

DETAILED DESCRIPTION

Those of ordinary skilled in the art will appreciate that modifications or equivalent substitutions may be made to the technical solutions of embodiments of the present application without departing from the spirit and scope of the technical solutions of the present application, all of which should fall within the scope of the claims of the present application.

Figure 1:
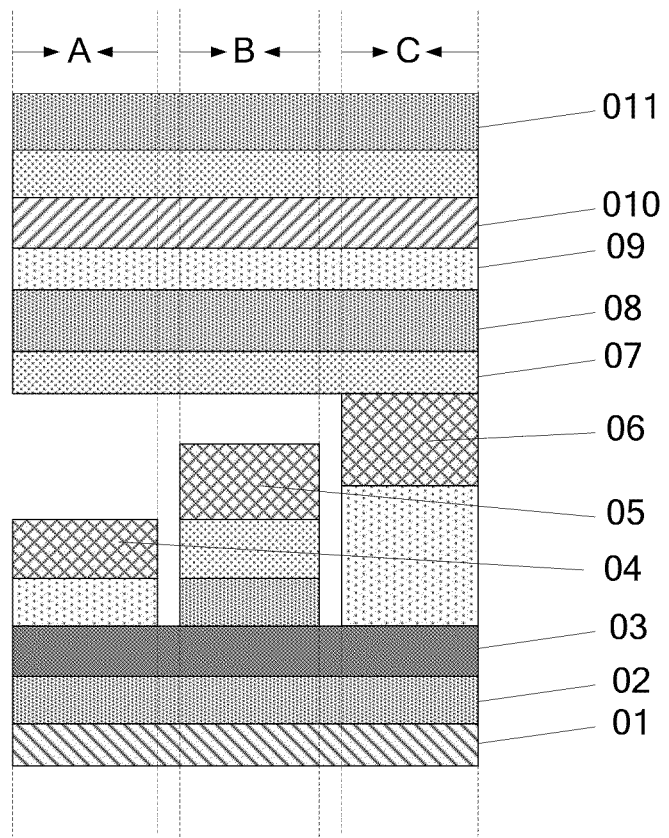
FIG. 1 is a schematic structural diagram of film layers of a pixel unit of an OLED display substrate in some technologies.

As shown in FIG. 1, some OLED substrates are made by the solution of red, green and blue sub-pixels. A plurality of pixel units are arranged in a display region of the OLED substrate in an array. Each pixel unit includes three sub-pixels, i.e., a first sub-pixel A (e.g., a blue sub-pixel), a second sub-pixel B (e.g., a green sub-pixel) and a third sub-pixel C (e.g., a red sub-pixel). The light-emitting layers (i.e., a first light-emitting layer 04, a second light-emitting layer 05, and a third light-emitting layer 06) of the three sub-pixels are arranged in three sub-pixel regions respectively. The pixel unit further includes a first electrode layer 01 adjacent to the base substrate; a hole injection layer 02 and a hole transport layer 03 arranged on a side of the first electrode layer 01 towards the light-emitting layer of each sub-pixel; a hole blocking layer 07, an electron transport layer 08 and an electron injection layer 09 arranged on a side of the light-emitting layer of each sub-pixel towards the second electrode layer 010; and an encapsulation layer 011 arranged on a side of the second electrode layer 010 facing away from the base substrate. In the process of preparing film layers of the pixel units, other than some common film layers (such as, a hole injection layer 02, and a hole transport layer 03), the light-emitting layer (i.e., the first light-emitting layer 04, the second light-emitting layer 05 or the third light-emitting layer 06) of each sub-pixel is prepared by vapor deposition. A fine mask (FMM) is required to be used in the process of vapor deposition. In addition, the FMM is also required to be used in the preparation of some non-common film layers (such as some unique film layers of some sub-pixels between the light-emitting layer of the sub-pixel and the hole transport layer 03). Therefore, for preparing the whole OLED substrate shown in FIG. 1, the FMMs may be used for multiple times and in a large quantity. The FMM is expensive. Precise alignment of the mechanism is required during use, and requirements for process equipment are higher, various resulting defects are prone to occur, thereby increasing the manufacturing cost of OLED substrates.

Figure 2:
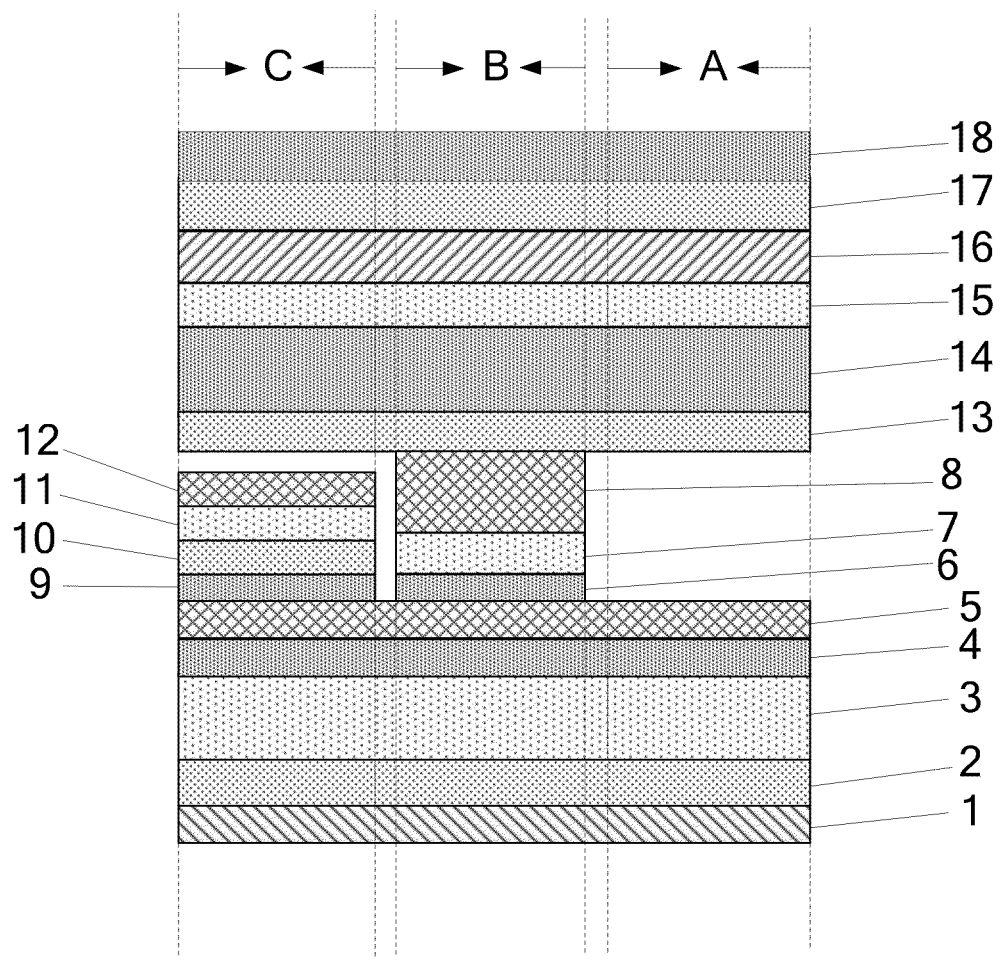
FIG. 2 is a schematic structural diagram of film layers of a pixel unit in a display region of an OLED display substrate according to an exemplary embodiment.
Figure 3:
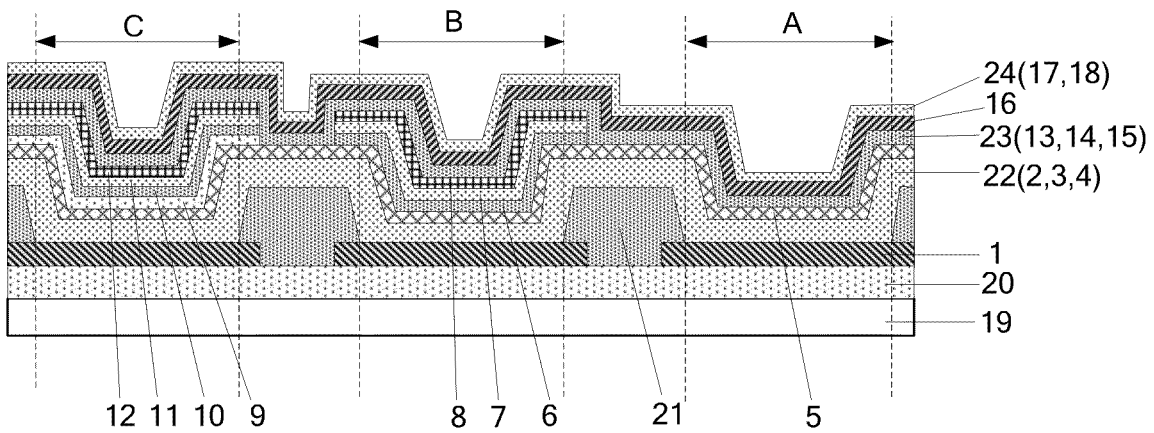
FIG. 3 is a schematic sectional structural diagram of a pixel unit in the display region of the OLED display substrate in FIG. 2 according to some exemplary embodiments.
Figure 4:
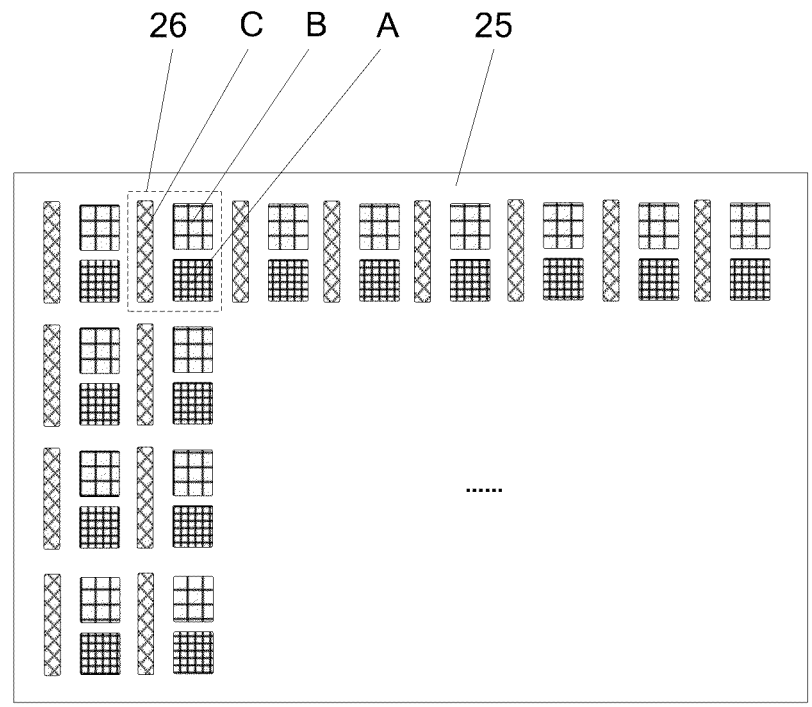
FIG. 4 is a schematic structural diagram of an arrangement of sub-pixels of a display region of an OLED display substrate according to an exemplary embodiment.

As shown in FIG. 2, FIG. 3 and FIG. 4, FIG. 2 shows a schematic structural diagram of a pixel unit in the display region 25 of an OLED display substrate according to an embodiment of the present application. FIG. 2 is drawn for ease of identifying the position of each film layer in the display region 25 of the OLED display substrate. The sectional structure of the display region 25 of the OLED display substrate may be shown in FIG. 3. An embodiment of the present application provides an OLED display substrate including a base substrate 19 with a display region 25 arranged thereon. A first sub-pixel A, a second sub-pixel B and a third sub-pixel C for respectively displaying different colors are arranged in the display region 25. A first electrode layer 1, a pixel defining layer 21, a second electrode layer 16 and organic functional layers between the first electrode layer 1 and the second electrode layer 16 are arranged in the display region 25. The first electrode layer 1 includes a plurality of first electrodes respectively arranged in the first sub-pixel A, the second sub-pixel B and the third sub-pixel C. The pixel defining layer 21 is arranged on the first electrode layer 1, and is provided with first, second and third openings for respectively defining the first sub-pixel A, the second sub-pixel B and the third sub-pixel C. Surfaces of the first electrodes in the defined sub-pixels towards the second electrode layer 16 are exposed from the first, second and third openings respectively. The organic functional layers include a first light-emitting layer 5, a second light-emitting layer 8 and a third light-emitting layer 12. The first light-emitting layer 5 covers the display region 25 and is an integral structure. The second light-emitting layer 8 and the third light-emitting layer 12 are arranged on a side of the first light-emitting layer 5 towards the second electrode layer 16. The second light-emitting layer 8 includes a plurality of second sub light-emitting layers. An orthographic projection of the second sub light-emitting layers on the base substrate 19 completely covers an orthographic projection of the second opening on the base substrate 19, and does not overlap with orthographic projections of the first and third openings on the base substrate 19. The third light-emitting layer 12 includes a plurality of third sub light-emitting layers. An orthographic projection of the third sub light-emitting layers on the base substrate 19 completely covers an orthographic projection of the third opening on the base substrate 19, and does not overlap with orthographic projections of the first and second openings on the base substrate 19.

Figure 5:
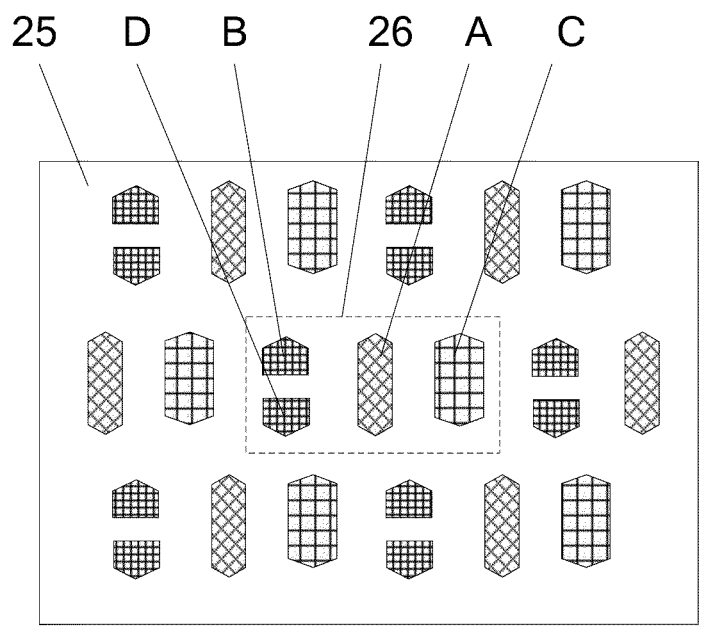
FIG. 5 is a schematic structural diagram of an arrangement of sub-pixels of a display region of an OLED display substrate according to another exemplary embodiment.

As shown in FIG. 4, in an example, a plurality of pixel units 26 are arranged in the display region 25 of the base substrate 19 in an array. The pixel units 26 are the smallest display units capable of displaying almost all colors, which are also termed as pixels of display images. Each of the pixel units 26 includes a plurality of sub-pixels. The light emitted by the plurality of sub-pixels may be mixed with each other to obtain various colors, so that each of the pixel units 26 is able to display various colors (such as white). For example, each of the pixel units 26 includes a first sub-pixel A (which may be a red sub-pixel), a second sub-pixel B (which may be a green sub-pixel), and a third sub-pixel C (which may be a blue sub-pixel). This mode is known as the RGB mode. Although FIG. 4 merely shows one arrangement of the pixel units 26, the arrangement of the pixel units 26, the arrangement of the plurality of sub-pixels in the pixel unit 26, the number of the plurality of sub-pixels in the pixel unit 26, and the colors of light emitted by different sub-pixels are not limited in the embodiments of the present application. For example, in some other exemplary embodiments, as shown in FIG. 5, each of the pixel units 26 may include a first sub-pixel A (which may be a red sub-pixel), a second sub-pixel B (which may be a green sub-pixel), a third sub-pixel C (which may be a blue sub-pixel) and a fourth sub-pixel D (which may be a green sub-pixel). Both of the second sub-pixel B and the fourth sub-pixel D may be green sub-pixels. The second sub-pixel B and the fourth sub-pixel D may have the same structure.

As shown in FIG. 3 and FIG. 4, according to an embodiment of the present application, the region of the first sub-pixel A in the direction parallel to the base substrate 19 is a region in which the orthogonal projection of all film layers stacked from the first electrode corresponding to the first opening to the second electrode layer 16 on the base substrate 19 overlaps with the orthogonal projection of the first opening on the base substrate 19. The region of the second sub-pixel B in the direction parallel to the base substrate 19 is a region in which the orthogonal projection of all film layers stacked from the first electrode corresponding to the second opening to the second electrode layer 16 on the base substrate 19 overlaps with the orthogonal projection of the second opening on the base substrate 19. The region of the third sub-pixel C in the direction parallel to the base substrate 19 is a region in which the orthogonal projection of all film layers stacked from the first electrode corresponding to the third opening to the second electrode layer 16 on the base substrate 19 overlaps with the orthogonal projection of the third opening on the base substrate 19. The first sub-pixel A, the second sub-pixel B, and the third sub-pixel C each includes all the film layers in the region in a direction parallel to the base substrate 19 from the first electrode to the second electrode layer.

In an embodiment of the present application, when light is emitted from the first light-emitting layer 5, charges (such as electrons) from the second electrode layer 16 are not able to enter the first light-emitting layer 5 in the regions where the second sub-pixel B and the third sub-pixel C are located, but may enter the first light-emitting layer 5 in the region where the first sub-pixel A is located. Therefore, when light is emitted from the first light-emitting layer 5, light is merely emitted from the region where the first sub-pixel A is located, but is not emitted from the first light-emitting layer 5 in the regions where the second sub-pixel B and the third sub-pixel C are located due to a lack of recombination of the electrons and holes. The first light-emitting layer 5 in the regions where the second sub-pixel B and the third sub-pixel C are located functions to transmit charges (such as holes) from the first electrode layer 1.

In an embodiment of the present application, all of the first light-emitting layer 5, the second light-emitting layer 8 and the third light-emitting layer 12 may be prepared by vapor deposition. In the process for preparing the first light-emitting layer 5, an open mask may be used. The open mask may have only one opening, so that the resulting first light-emitting layer 5 covers the whole display region and is an integral structure. Corresponding fine masks (FMM) may be used in the process for preparing the second light-emitting layer 8 and the third light-emitting layer 12. The vapor deposition material for forming the second light-emitting layer 8 may be deposited in the region where the second sub-pixel B is located. The vapor deposition material for forming the third light-emitting layer 12 may be deposited in the region where the third sub-pixel C is located.

In an embodiment of the present application, as the first light-emitting layer 5 covers the display region 25 and is an integral structure, the first light-emitting layer 5 is a common layer for all sub-pixels. As a result, FMM is no longer needed in the process for preparing the first light-emitting layer 5. Compared with the structure of the OLED display substrate in FIG. 1, the preparation process of the OLED display substrate in the embodiments of the present application eliminates at least one process using FMM, thus reducing the number of use and quantity of FMMs, reducing material cost, simplifying process, reducing production cost, and potentially improving specific productivity. In addition, the manufacturing of the OLED display substrate of the embodiments of the present application may be completely compatible with the existing equipments and processes for mass production of OLED.

In some exemplary embodiments, one of the first electrode layer 1 and the second electrode layer 16 is an anode layer, and the other is a cathode layer. In an example of the embodiment, the first electrode layer 1 is an anode layer and the second electrode layer 16 is a cathode layer. The first electrode layer 1 may be closer to the base substrate 19 of the OLED display substrate than the second electrode layer 16. The OLED display substrate may further include a driving structural layer 20 arranged on the base substrate 19. The first electrode layer 1 is arranged on the driving structural layer 20. The driving structural layer 20 may include a plurality of pixel circuits. Each pixel circuit is configured to independently drive a corresponding sub-pixel for display. Each pixel circuit may include a plurality of thin film transistors. The drain electrode of one of the thin film transistors is connected to the first electrode in a sub-pixel driven by the pixel circuit, to independently control the display of the sub-pixel.

In some exemplary embodiments, the second light-emitting layer 8 is not in contact with the first light-emitting layer 5. The third light-emitting layer 12 is not in contact with the first light-emitting layer 5. That is, other film layers may be arranged between the second light-emitting layer 8 and the first light-emitting layer 5, and between the third light-emitting layer 12 and the first light-emitting layer 5.

In some exemplary embodiments, the orthographic projection of the second sub light-emitting layers on the base substrate 19 overlaps or contacts with the orthographic projection of the third sub light-emitting layers on the base substrate 19. In this embodiment, the second light-emitting layer 8 and the third light-emitting layer 12 may be prepared by vapor deposition. In the preparing process, the vapor deposition material for forming the second light-emitting layer 8 may be deposited in the second sub-pixel B, and the vapor deposition material for forming the third light-emitting layer 12 may be deposited in the third sub-pixel C by corresponding fine masks (FMM). In the process of vapor deposition, as the misalignment between the FMM and the base substrate 19, the orthographic projection of the second sub light-emitting layers on the base substrate 19 may overlap or contact with the orthographic projection of the third sub light-emitting layers on the base substrate 19.

In some exemplary embodiments, the number of the organic functional layers in the first sub-pixel A is less than that of the organic functional layers in the second sub-pixel B, and less than that of the organic functional layers in the third sub-pixel C. In an example of the embodiment, each of the organic functional layers in the first sub-pixel A covers the display region 25 and is an integral structure. Other film layers may be further arranged between the second light-emitting layer 8 and the first light-emitting layer 5, and between the third light-emitting layer 12 and the first light-emitting layer 5.

In some exemplary embodiments, each of the film layers on a side of the first electrode exposed by the first opening facing away from the base substrate 19 covers the display region 25 and is an integral structure. In this way, each of the film layers on the side of the first electrode facing away from the base substrate 19 in the first sub-pixel A is a common film layer for all sub-pixels, and FMM is no longer needed for preparing these common film layers. When these film layers are prepared by vapor deposition, an open mask may be used. The open mask may have only one opening. Compared with the process using FMM, the process difficulty and production cost may be reduced.

In some exemplary embodiments, the first light-emitting layer 5 is a red light-emitting layer, the second light-emitting layer 8 is a green light-emitting layer, and the third light-emitting layer 12 is a blue light-emitting layer.

In some exemplary embodiments, the hole mobility of the host material of the first light-emitting layer 5 is no less than $1\times10^{-6}$ cm$^2$/Vs. The first light-emitting layer 5 serves as a common layer. In view of the light-emitting characteristics of the second sub-pixel B and the third sub-pixel C, the host material of the first light-emitting layer 5 should have a high hole mobility of no less than $1\times10^{-6}$ cm$^2$/Vs tested by the space charge limited current (SCLC) method, so as to ensure the voltage and light-emitting efficiency of the second sub-pixel B and the third sub-pixel C. The hole mobility may be tested by the space charge limited current (SCLC) method. In an example of the embodiment, the light-emitting host in the first light-emitting layer 5 (i.e., the host material in the first light-emitting layer 5) may be a bipolar single-host material or a double-host material formed by blending a hole-type host with an electronic-type host. The hole-type host material may include carbazole group, thiophene group and the like. The electronic-type host material may include triazine group, triphenylamine group and the like. The light-emitting guest (that is, the guest material in the first light-emitting layer 5, i.e., the dopant material) may be a platinum group metal complex material, such as iridium (Ir), platinum (Pt). The dopant ratio of the light-emitting guest in the first light-emitting layer 5 is 2%-5%. The thickness of the first light-emitting layer 5 may be 25-40 nm.

In the present application, a material with a larger proportion in the same film layer is termed as a host material, and a material with a smaller proportion is termed as a guest material or a dopant material. The host material in the light-emitting layer is termed as the light-emitting host material, and the guest material (dopant material) in the light-emitting layer is termed as the light-emitting guest material (dopant material). In the present application, "dopant ratio" or "dopant concentration" means the proportion (which may refer to a volume ratio) of guest materials or dopant materials in the film layer.

In some exemplary embodiments, the electron mobility of the host material of the third light-emitting layer 12 is no less than $1\times10^{-7}$ cm$^2$/Vs. In an example of the embodiment, the first light-emitting layer 5 is a red light-emitting layer, and the third light-emitting layer 12 is a blue light-emitting layer. Given that generally a small organic molecule material has a hole mobility of at least one order of magnitude higher than its electron mobility, holes may reach the light-emitting layer first. In order to help improve performances of blue light-emitting devices, the host material of the third light-emitting layer 12 may be a material with good electron transport performances. According to the space charge limited current (SCLC) test, the electron mobility of the host material of the third light-emitting layer 12 may be no less than $1\times10^{-7}$ cm$^2$/Vs under the condition of $2.5\times10^7$ V/m. In the third light-emitting layer 12, the host material may be an anthracene, fluorene or pyrene derivative, and the guest material may be a pyrene derivative. The dopant concentration of the guest material in the third light-emitting layer 12 may be 0.5-6%. That is, the proportions of the host material and the guest material in the third light-emitting layer 12 may be 94-99.5%, and 0.5-6% respectively.

In some exemplary embodiments, the organic functional layers may further include any one or more of the following film layers arranged between the first electrode layer 1 and the first light-emitting layer 5 and covering the display region 25 and each being an integral structure: a first hole injection layer 2, a first hole transport layer 3 and a first blocking layer 4. The first blocking layer 4 is configured to block outward migration of excitons in the first light-emitting layer 5.

In some exemplary embodiments, the film layers arranged between the first electrode layer 1 and the first light-emitting layer 5 and covering the display region 25 and each being an integral structure include the first hole injection layer 2, the first hole transport layer 3 and the first blocking layer 4 sequentially stacked in a direction from the first electrode layer 1 to the first light-emitting layer 5. The first hole injection layer 2 is arranged on a surface of the first electrode layer 1 facing away from the base substrate 19. The first light-emitting layer 5 is arranged on a surface of the first blocking layer 4 facing away from the base substrate 19. In FIG. 3, the first structural layer 22 represents the first hole injection layer 2, the first hole transport layer 3, and the first blocking layer 4 which are sequentially stacked. In the embodiment, the first hole injection layer 2 functions to reduce the hole injection barrier and improve the hole injection efficiency. The first hole transport layer 3 functions to improve the hole transport rate, reduce the hole injection barrier and improve the hole injection efficiency. The first blocking layer 4 is configured to block outward migration (i.e., in a direction towards the first electrode layer 1) of excitons in the first light-emitting layer 5, thereby improving the light-emitting efficiency of the first light-emitting layer 5. The first blocking layer 4 may also reduce the injection barrier of holes from the first hole transport layer 3 to the first light-emitting layer 5.

In the exemplary embodiment, each of the first light-emitting layer 5, the first blocking layer 4, the first hole transport layer 3 and the first hole injection layer 2 covers the display region 25, and is an integral structure and used as a common layer. The first light-emitting layer 5, the first blocking layer 4, the first hole transport layer 3 and the first hole injection layer 2 may be prepared by vapor deposition. An open mask may be used instead of FMM in the vapor deposition process, which may reduce production cost and process difficulty compared with the process using FMM. In addition, these film layers may also be prepared by a solution method, such as spin coating, spray coating, screen printing, ink-jet printing. Compared with the structure of the OLED display substrate in FIG. 1, the preparation process of the OLED display substrate of the exemplary embodiment eliminates multiple steps using FMM, reduces the number of use and quantity of FMM, simplifies the preparation operation, reduces the production cost, and improves the productivity.

In some exemplary embodiments, the highest occupied molecular orbital (HOMO) energy level of the host material of the first blocking layer 4 is 0-0.3 eV higher than that of the host material of the first hole transport layer 3.

Generally, the values of the highest occupied molecular orbital (HOMO) energy level and the lowest unoccupied molecular orbital (LUMO) energy level are usually negative values. In the present application, HOMO (or LUMO) energy level is relatively high, which means that the absolute value of HOMO (or LUMO) energy level is relatively high.

In the embodiment, the influence of the HOMO difference between the first blocking layer 4 and the first hole transport layer 3 on the device performances of the first sub-pixel A is shown in Table 1 below. In Table 1, the "voltage" refers to the voltage between the corresponding two electrodes (i.e., the first electrode layer 1 and the second electrode layer 16 in the first sub-pixel A) of the device under the current density of 15 mA/cm$^2$. The "efficiency" refers to current efficiency, which may be used to characterize light-emitting efficiency. The data of "voltage" column and "efficiency" column indicate that when taking the voltage and efficiency of device 1 as the standard, the voltage of device 2 is 97% of that of device 1 and the efficiency of device 2 is 135% of that of device 1. It can be seen that device 2 has lower voltage and higher efficiency, that is, higher light-emitting efficiency and better device performances.

TABLE 1

| first sub-pixel A | HOMO difference between the first blocking layer 4 and the first hole transport layer 3 | current density (mA/cm$^2$) | voltage | efficiency |
|---|---|---|---|---|
| device 1 | 0.2 | 15 | 100% | 100% |
| device 2 | 0.1 | | 97% | 135% |

In some exemplary embodiments, the HOMO energy level of the host material of the first hole transport layer 3 is −5.2 eV to −5.6 eV. In an example of the embodiment, the first hole transport layer 3 may be prepared by vapor deposition of a carbazole material with higher hole mobility, to obtain a thickness of 100-140 nm. The first blocking layer 4 may be prepared by vapor deposition of a carbazole material, to obtain a thickness of 10-60 nm.

In some exemplary embodiments, the first hole injection layer 2 may be prepared from at least one of HATCN (2,3,6,7,10,11-hexacyano-1,4,5,8,9,12-hexaazatriphenylene) and CuPc (copper phthalocyanine). The first hole injection layer 2 may also be prepared from a mixed material of a hole transport material (host material) and a p-type dopant material. The dopant concentration of the p-type dopant material is 0.5%-10%. For example, the material of the first hole injection layer 2 may be a NPB: $F_4TCNQ$ formed by doping $F_4TCNQ$ (2,3,5,6-tetrafluoro-7,7',8,8'-tetracyanoquinodimethane) into NPB (N,N'-bis(1-naphthyl)-N,N'-diphenyl-1,1'-biphenyl-4-4'-diamine), or a TAPC:$MoO_3$ formed by doping $MoO_3$ (molybdenum trioxide) into TAPC (4,4'-cyclohexyl bis[N,N-bis(4-methylphenyl) aniline]). The thickness of the first hole injection layer 2 may be 5 nm to 20 nm.

In some exemplary embodiments, the organic functional layers may further include any one or more of the following film layers arranged between the first light-emitting layer 5 and the second light-emitting layer 8: a second blocking layer 7 and a second hole injection layer 6. The second blocking layer 7 is configured to block outward migration of excitons in the second light-emitting layer 8. An orthographic projection of the film layer or film layers arranged between the first light-emitting layer 5 and the second light-emitting layer 8 on the base substrate 19 completely covers an orthographic projection of the second opening on the base substrate 19, and does not overlap with an orthographic projections of the first and third openings on the base substrate 19.

In some exemplary embodiments, the film layers arranged between the first light-emitting layer 5 and the second light-emitting layer 8 include the second hole injection layer 6 and the second blocking layer 7 sequentially stacked in a direction from the first light-emitting layer 5 to the second light-emitting layer 8. The second hole injection layer 6 is arranged on a surface of the first light-emitting layer 5 facing away from the base substrate 19. The second light-emitting layer 8 is arranged on a surface of the second blocking layer 7 facing away from the base substrate 19.

In some exemplary embodiments, the HOMO energy level of the host material of the second hole injection layer 6 is 0-0.5 eV higher than that of the host material of the first light-emitting layer 5. In this way, on the one hand, holes may be easily transported from the first light-emitting layer 5 to the second hole injection layer 6, and on the other hand, the hole injection barrier between the first light-emitting layer 5 and the second hole injection layer 6 will not be too high, too high of the hole injection barrier will cause a too high driving voltage between the first electrode layer 1 and the second electrode layer 16 in the second sub-pixel B.

In some exemplary embodiments, materials of the second hole injection layer 6 may include a host material (which may be a hole type material) and a p-type dopant material. The material of the second blocking layer 7 may be the same as the host material of the second hole injection layer 6. In an example of the embodiment, the dopant concentration of the p-type dopant material in the second hole injection layer 6 may be 1%-8%. Including the p-type dopant material in the second hole injection layer 6 may improve the hole mobility of the second hole injection layer 6. The thickness of the second hole injection layer 6 may be 1 nm to 10 nm. The second hole injection layer 6 functions to reduce the injection barrier of holes from the first light-emitting layer 5 to the second blocking layer 7 and the second light-emitting layer 8, and improve the hole injection efficiency. The thickness of the second blocking layer 7 may be 50-70 nm.

In some exemplary embodiments, the film layers arranged between the first light-emitting layer 5 and the second light-emitting layer 8 include the second blocking layer 7. The second blocking layer 7 is arranged on a surface of the first light-emitting layer 5 facing away from the base substrate 19. The second light-emitting layer 8 is arranged on a surface of the second blocking layer 7 facing away from the base substrate 19.

In some exemplary embodiments, the HOMO energy level of the host material of the second blocking layer 7 is 0-0.3 eV higher than that of the host material of the first light-emitting layer 5. In this way, on the one hand, holes may be easily transported from the first light-emitting layer 5 to the second blocking layer 7, and on the other hand, the hole injection barrier between the first light-emitting layer 5 and the second blocking layer 7 will not be too high, too high of the hole injection barrier will cause a too high driving voltage between the first electrode layer 1 and the second electrode layer 16 in the second sub-pixel B.

In some exemplary embodiments, all of the second light-emitting layer 8, the second blocking layer 7 and the second hole injection layer 6 may be prepared by vapor deposition. In the process of forming the three film layers by vapor deposition, the vapor deposition materials for forming the corresponding film layers may be deposited in the region of the second sub-pixel B by FMM.

In some exemplary embodiments, the first light-emitting layer 5 is a red light-emitting layer, and the second light-emitting layer 8 is a green light-emitting layer. In an example of the embodiment, in the second light-emitting layer 8, the light-emitting host may be a bipolar single-host material or a double-host material formed by blending a hole-type host with an electron-type host. The light-emitting guest may be a platinum group metal complex material, such as iridium (Ir) or platinum (Pt). The dopant ratio of the light-emitting guest in the second light-emitting layer 8 may be 5%-15%. The thickness of the second light-emitting layer 8 may be 25-35 nm. The influence of the dopant ratio of the light-emitting guest in the second light-emitting layer 8 on the device performances of the second sub-pixel B is shown in Table 2 below. The "voltage" refers to the voltage between the corresponding two electrodes (i.e., the first electrode layer 1 and the second electrode layer 16 in the second sub-pixel B) of the device under the current density of 15 mA/cm$^2$. The "efficiency" refers to current efficiency, which may be used to characterize light-emitting efficiency. The data in "voltage" column, "efficiency" column and "life" column indicate that when taking the voltage, efficiency and life of device 1 as the standard, the voltage of device 2 is 104% of that of device 1, the efficiency of device 2 is 104% of that of device 1, and the life of device 2 is the same as that of device 1. It can be seen that the driving voltage and light-emitting efficiency of the second sub-pixel B increase with the increase of the dopant ratio of the light-emitting guest in the second light-emitting layer 8. Therefore, dopant ratio of the light-emitting guest in the second light-emitting layer 8 may be selected in a proper way as needed.

TABLE 2

| second sub-pixel B | dopant ratio | current density (mA/cm²) | voltage | efficiency | life |
|---|---|---|---|---|---|
| device 1 | 10% | 15 | 100% | 100% | 100% |
| device 2 | 12% |  | 104% | 104% | 100% |

In some exemplary embodiments, the organic functional layers may further include any one or more of the following film layers arranged between the first light-emitting layer 5 and the third light-emitting layer 12: the third blocking layer 11, the third hole transport layer 10 and the third hole injection layer 9. The third blocking layer 11 is configured to block outward migration of excitons in the third light-emitting layer 12. An orthographic projection of the the film layer or film layers arranged between the first light-emitting layer 5 and the third light-emitting layer 12 on the base substrate 19 completely covers an orthographic projection of the third opening on the base substrate 19, and does not overlap with an orthographic projections of the first and second openings on the base substrate 19. In the embodiment, the third hole injection layer 9 functions to reduce the hole injection barrier and improve the hole injection efficiency.

In some exemplary embodiments, all of the third light-emitting layer 12, the third blocking layer 11, the third hole transport layer 10 and the third hole injection layer 9 may be prepared by vapor deposition. In the process of forming the four film layers by vapor deposition, the vapor deposition materials for forming the corresponding film layers may be deposited in the region of the third sub-pixel C by FMM.

In some exemplary embodiments, the orthographic projection of the film layer or film layers arranged between the first light-emitting layer 5 and the third light-emitting layer 12 on the base substrate 19 overlaps or contacts with the orthographic projection of the film layer or film layers arranged between the first light-emitting layer 5 and the second light-emitting layer 8 on the base substrate 19. In the embodiment, during the process of the vapor deposition, the due to possible misalignment between the FMM and the base substrate 19, the orthographic projection of the film layer or film layers formed between the first light-emitting layer 5 and the third light-emitting layer 12 on the base substrate 19 may overlap or contact with the orthographic projection of the film layer or film layers formed between the first light-emitting layer 5 and the second light-emitting layer 8 on the base substrate 19.

In some exemplary embodiments, the film layers arranged between the first light-emitting layer 5 and the third light-emitting layer 12 include the third hole injection layer 9, the third hole transport layer 10 and the third blocking layer 11 sequentially stacked in a direction from the first light-emitting layer 5 to the third light-emitting layer 12. The third hole injection layer 9 is arranged on a surface of the first light-emitting layer 5 facing away from the base substrate 19. The third light-emitting layer 12 is arranged on a surface of the third blocking layer 11 facing away from the base substrate 19.

In some exemplary embodiments, the HOMO energy level of the host material of the third hole injection layer 9 is 0-0.5 eV higher than that of the host material of the first light-emitting layer 5.

In some exemplary embodiments, the film layers arranged between the first light-emitting layer 5 and the third light-emitting layer 12 include the third hole transport layer 10 and the third blocking layer 11 sequentially stacked in a direction from the first light-emitting layer 5 to the third light-emitting layer 12. The third hole transport layer 10 is arranged on a surface of the first light-emitting layer 5 facing away from the base substrate 19. The third light-emitting layer 12 is arranged on a surface of the third blocking layer 11 facing away from the base substrate 19.

In some exemplary embodiments, the HOMO energy level of the host material of the third hole transport layer 10 is 0-0.3 eV higher than that of the host material of the first light-emitting layer 5.

In some exemplary embodiments, the HOMO energy level of the host material of the third blocking layer 11 is 0-0.3 eV higher than that of the host material of the third hole transport layer 10. In an example of the embodiment, the third blocking layer 11 is configured to block outward migration of excitons in the third light-emitting layer 12 and effectively transport holes. The third blocking layer 11 may be made of hole-type material with higher triplet energy level (T1). The influence of the amount of the triplet energy level (T1) of the material of the third blocking layer 11 on the device performances of the third sub-pixel C is shown in Table 3 below. The "T1" refers to the triplet energy level of the material of the third blocking layer 11 of the device. The "voltage" refers to the voltage between the corresponding two electrodes (i.e., the first electrode layer 1 and the second electrode layer 16 in the third sub-pixel C) of the device under the current density of 15 mA/cm². The "efficiency" refers to the current efficiency, which may be used to characterize the light-emitting efficiency. The data in "T1" column, "voltage" column and "efficiency" column indicate that when taking the T1, voltage and efficiency of device 1 as the standard, the T1 of the material of the third blocking layer 11 of device 2 is 104% of that of the material of the third blocking layer 11 of device 1, the voltage of device 2 is 97% of that of device 1, and the efficiency of device 2 is 103% of that of device 1. It can be seen that the third blocking layer 11 being made of materials with higher triplet energy level (T1) is beneficial to reduce the driving voltage of the third sub-pixel C and improve the light-emitting efficiency.

TABLE 3

| third sub-pixel C | T1 | current density (mA/cm²) | voltage | efficiency |
|---|---|---|---|---|
| device 1 | 100% | 15 | 100% | 100% |
| device 2 | 104% |  | 97% | 103% |

In some exemplary embodiments, the materials of the third hole injection layer 9 include a host material and a p-type dopant material. In an example of the embodiment, the dopant concentration of the p-type dopant material in the third hole injection layer 9 may be 1%-8%. The materials of the third hole injection layer 9 include the p-type dopant material, which may improve the hole mobility of the third hole injection layer 9. The host material of the third hole injection layer 9 may be the same as that of the first hole injection layer 2. The thickness of the third hole injection layer 9 may be 1 nm to 10 nm. The materials of the third hole transport layer 10 may be the same as those of the first hole transport layer 3. The thickness of the third hole transport layer 10 may be 30-60 nm. The third blocking layer 11 is configured to block outward migration (i.e., in a direction towards the first electrode layer 1) of excitons in the third light-emitting layer 12. The thickness of the third blocking layer 11 may be 1-10 nm.

In some exemplary embodiments, the first light-emitting layer 5 is a red light-emitting layer, and the third light-emitting layer 12 is a blue light-emitting layer. In an example of the embodiment, in the third light-emitting layer 12, the host material may be an anthracene, fluorene or pyrene derivative, and the guest material may be a pyrene derivative. The dopant concentration of the guest material in the third light-emitting layer 12 may be 0.5-6%. The thickness of the third light-emitting layer 12 may be 15-25 nm.

In some exemplary embodiments, the organic functional layers may further include any one or more of the following film layers arranged on a side of the first light-emitting layer 5, the second light-emitting layer 8 and the third light-emitting layer 12 towards the second electrode layer 16 and covering the display region 25 and each being an integral structure: a hole blocking layer 13, an electron transport layer 14 and an electron injection layer 15.

In some exemplary embodiments, the film layers arranged on the side of the first light-emitting layer 5, the second light-emitting layer 8 and the third light-emitting layer 12 towards the second electrode layer 16 and covering the display region 25 and each being an integral structure include the hole blocking layer 13, the electron transport layer 14 and the electron injection layer 15 sequentially stacked in a direction from the first light-emitting layer 5, the second light-emitting layer 8 and the third light-emitting layer 12 to the second electrode layer 16. The hole blocking layer 13 is arranged on a surface of the portion of the first light-emitting layer 5 corresponding to the first opening facing away from the base substrate 19, and on surfaces of the second light-emitting layer 8 and the third light-emitting layer 12 facing away from the base substrate 19. The second electrode layer 16 is arranged on a surface of the electron injection layer 15 facing away from the base substrate 19. In the embodiment, the hole blocking layer 13 may block mobility of the holes in the portion of the first light-emitting layer 5 located in the first sub-pixel A and the holes in the second light-emitting layer 8 and the third light-emitting layer 12 towards the second electrode layer 16, so as to improve the light-emitting efficiency of the corresponding light-emitting layers. The electron transport layer 14 may increase the electron transport rate. The electron injection layer 15 may reduce the electron injection barrier and improve the electron injection efficiency. In FIG. 3, the second structural layer 23 represents the hole blocking layer 13, the electron transport layer 14, and the electron injection layer 15 which are stacked. It can be seen in connection with FIG. 3 that although it appears that there are gaps between the hole blocking layer 13 and the third light-emitting layer 12, and between the hole blocking layer 13 and the first light-emitting layer 5 in FIG. 2, there is actually no gap. The surfaces of the film layers in FIG. 2 are simply illustrated as flat surfaces, but in fact, the surfaces of some film layers are undulating. FIG. 2 is drawn for ease of identifying the position of each film layer in the display region 25. In addition, the pixel defining layer for defining each sub-pixel is not shown in FIG. 2.

In the exemplary embodiments, each of the hole blocking layer 13, the electron transport layer 14, and the electron injection layer 15 covers the display region 25, and is an integral structure and used as a common layer. These film layers may be prepared by vapor deposition. An open mask may be used in the vapor deposition process. These film layers may also be prepared by a solution method, such as spin coating, spray coating, screen printing, ink-jet printing. The second electrode layer 16 may cover the display region 25, and is an integral structure and used as a common layer. In this way, each of the film layers on a side of the first electrode in the first sub-pixel A facing away from the base substrate 19 may cover the display region 25, be an integral structure and used as a common layer. Therefore, the side of the first electrode facing away from the base substrate 19 in the first sub-pixel A may no longer be provided with non-common unique film layers, and FMM is no longer needed for preparing all of the common film layers in the first sub-pixel A. Compared with the structure of the OLED display substrate shown in FIG. 1, the preparation process of the OLED display substrate of the exemplary embodiment eliminates multiple steps using FMM, reduces the number of use and quantity of FMM, simplifies the preparation operation, reduces the production cost, and improves the productivity.

In some exemplary embodiments, the LUMO energy level of the host material of the hole blocking layer 13 is 0-0.5 eV higher than that of the host material of the second light-emitting layer 8. In the embodiment, in the second light-emitting layer 8, in the case that the light-emitting host is a single-host material, the LUMO energy level refers to the LUMO energy level of the single-host material; and in the case that the light-emitting host is a double-host material, the LUMO energy level refers to the LUMO energy level of the electronic-type host material of the double-host material.

In some exemplary embodiments, the electron mobility of the electron transport layer 14 is no less than $1\times10^{-6}$ cm$^2$/Vs. The electron transport layer 14 may be prepared by blending a thiophene, imidazole or azine derivative with quinoline lithium (such as 8-hydroxyquinoline lithium). The proportion of quinoline lithium in the electron transport layer 14 may be 30%-70%. The thickness of the electron transport layer 14 may be 20-40 nm. In an example of the embodiment, the influence of the magnitude of the electron mobility of the electron transport layer 14 on the device performances of the third sub-pixel C is shown in Table 4 below. The "voltage" refers to the voltage between the corresponding two electrodes (i.e., the first electrode layer 1 and the second electrode layer 16 in the third sub-pixel C) of the device under the current density of 15 mA/cm$^2$. The "efficiency" refers to the current efficiency, which may be used to characterize the light-emitting efficiency. The data in "electron mobility" column, "voltage" column and "efficiency" column indicate that when taking the electron mobility, voltage and efficiency of device 1 as the standard, the electron mobility, voltage and efficiency of device 2 are 167%, 96% and 102% of those of device 1, respectively. It can be seen that the electron transport layer 14 being made of materials with higher electron mobility (which may be measured by the SCLC method) may effectively reduce the driving voltage of each sub-pixel and improve the light-emitting efficiency.

TABLE 4

| third sub-pixel C | electron mobility | current density (mA/cm$^2$) | voltage | efficiency |
|---|---|---|---|---|
| device 1 | 100% | 15 | 100% | 100% |
| device 2 | 167% |  | 96% | 102% |

In some exemplary embodiments, the electron injection layer 15 may be prepared by vapor deposition of a lithium fluoride (LiF), LiQ, ytterbium (Yb), Ca or the like, to obtain a thickness of 0.5 nm to 2 nm. The thickness of the hole blocking layer 13 may be 2-10 nm.

In some exemplary embodiments, the reflectivity of the first electrode layer 1 is 85%-95%, and the transmittance of light with a wavelength of 530 nm through the second electrode layer 16 is 50%-60%.

In some exemplary embodiments, the first electrode layer 1 includes a silver (Ag) metal layer and a transparent oxide layer. The materials of the transparent oxide layer include at least one of indium tin oxide (ITO) and indium zinc oxide (IZO). In an example of the embodiment, the first electrode layer 1 is a reflective anode layer, which may be a composite structure including a metal layer with high reflectivity and a transparent oxide layer with high work function, such as "Ag/ITO" or "Ag/IZO". The thickness of the metal layer may be 80 nm to 100 nm. The thickness of the transparent oxide layer may be 5 nm to 10 nm. The average reflectivity for visible light of the materials of the first electrode layer 1 may be 85%-95%.

In some exemplary embodiments, the materials of the second electrode layer 16 include any one or more of the following: magnesium (Mg), silver (Ag), aluminum (Al), and magnesium-silver alloy. The ratio (molar ratio) of magnesium to silver in the magnesium-silver alloy may be 3:7 to 1:9. The second electrode layer 16 may be prepared by vapor deposition to obtain a thickness of 10-20 nm. The second electrode layer 16 may be a semi-reflective cathode layer.

In some exemplary embodiments, the OLED display substrate may further include a capping layer (CPL) 17 and an encapsulation layer 18 stacked on a side of the second electrode layer 16 away from the first electrode layer 1. In FIG. 3, the third structural layer 24 represents a capping layer (CPL) 17 and an encapsulation layer 18 which are stacked. The capping layer 17 may be prepared from small organic molecule material by vapor deposition to obtain a thickness of 50-80 nm. The refractive index of the capping layer 17 for light of 460 nm may be greater than 1.8, which may improve the light-emitting efficiency. The encapsulation layer 18 may be sealant encapsulation or thin film encapsulation.

In some exemplary embodiments, in order to obtain a top-emitting OLED display substrate with high light efficiency and high color purity, when designing the structure of the film layers of the OLED display substrate, optical microcavity structure characteristics should be taken into consideration. In an example of the embodiment, the first electrode layer 1 is a reflective anode layer, and the second electrode layer 16 is a semi-reflective cathode layer. Each sub-pixel forms a microcavity structure between the first electrode layer 1 and the second electrode layer 16. For the total film thickness of OLED light emitting devices including the first sub-pixel A, the second sub-pixel B and the third sub-pixel C (that is, the total film thickness of the organic functional layers between the first electrode layer 1 and the second electrode layer 16 of each sub-pixel), the primary condition for microcavity interference should be met:

$$2\sum n_i r_i + \frac{\phi}{2\pi}\lambda = k\lambda, k = 0, 1, 2, 3...$$

Wherein: $n_i$ is the refractive index of the organic layer i, $r_i$ is the actual thickness of the organic layer i, and $\lambda$ represents the interference wavelength. In an example of the embodiment, the first sub-pixel A is a red sub-pixel, the second sub-pixel B is a green sub-pixel, and the third sub-pixel C is a blue sub-pixel. The $\lambda$ values of the red, green and blue sub-pixels may be 620 nm, 530 nm and 460 nm respectively. $\psi$ represents the phase shift caused by the reflective surface (in this example, the first electrode layer 1). k is an integer, representing the $k^{th}$ interference period. In practice, for each sub-pixel, the selection of k is related to the total film layer thickness of the organic functional layers between the first electrode layer 1 and the second electrode layer 16 in the sub-pixel. With the increase of k, the interference enhancement is weaker. Therefore, the $0^{th}$ interference period or the $1^{st}$ interference period is generally selected. In an example of the embodiment, k is 0, representing the $0^{th}$ interference period, which has a strongest microcavity effect. In an example of the embodiment, according to the structure of the OLED display substrate, all of the film layers between the first electrode layer 1 and the second electrode layer 16 in the red sub-pixel are common layers of the display region 25. Therefore, the total thickness of these common layers should be considered comprehensively to meet the microcavity conditions of the red sub-pixel. For example, the microcavity may be adjusted by changing the thickness of the first hole transport layer 3 and the first blocking layer 4, so as to obtain the required optimal optical and electrical characteristics. For blue and green sub-pixels, the length of the microcavity should be adjusted by making adjustments to the thickness of non-common layers (e.g., for the blue sub-pixel, the third hole transport layer 10, the third blocking layer 11 and the third light-emitting layer 12; for the green sub-pixel, the second blocking layer 7 and the second light-emitting layer 8). By effectively applying microcavity effect, the thickness, material consumption and process time of organic functional layers may be reduced.

In some exemplary embodiments, the comparative results of the device performances of each sub-pixel of the OLED display substrate of the embodiments of the present application compared with the OLED display substrate in the related art shown in FIG. 1 are shown in Table 5 below. The "voltage" refers to the voltage between the two electrodes (i.e., the first electrode layer 1 and the second electrode layer 16) in each sub-pixel under the current density of 15 mA/cm$^2$ of the device. The "efficiency" refers to the current efficiency of each sub-pixel, which may be used to characterize the light-emitting efficiency. The data in the "voltage" column and "efficiency" column refer to, when taking the voltage and efficiency of the OLED device of each sub-pixel in the related art shown in FIG. 1 as the standard, the ratios of the voltage and efficiency of the OLED device of each sub-pixel in the embodiments of the present application to those of the corresponding sub-pixel in the related art shown in FIG. 1. It can be seen that, compared with the display substrate in the related art shown in FIG. 1, the driving voltage of the first sub-pixel A (such as a red sub-pixel) of the OLED display substrate in the embodiments of the present application is effectively reduced. The light-emitting efficiency of the second sub-pixel B (such as a green sub-pixel) and the third sub-pixel C (such as a blue sub-pixel) is comparable to that of the related art shown in FIG. 1.

TABLE 5

| devices | | current density (mA/cm$^2$) | voltage | efficiency |
|---|---|---|---|---|
| third sub-pixel C | the device in the related art | 15 | 100% | 100% |
| | the device of the embodiments of the present application | | 149% | 100% |

TABLE 5-continued

| devices | | current density (mA/cm$^2$) | voltage | efficiency |
|---|---|---|---|---|
| second sub-pixel B | the device in the related art | 15 | 100% | 100% |
| | the device of the embodiments of the present application | | 150% | 99% |
| first sub-pixel A | the device in the related art | 15 | 100% | 100% |
| | the device of the embodiment of the present application | | 81% | 81% |

An embodiment of the present application further provides a display apparatus including the described OLED display substrate. The display apparatus of the embodiment of the present application may be a product or component with a display function, such as a mobile phone, a tablet computer, a television, a display, a notebook computer, a digital photo frame, a navigator, etc.

What is claimed is:

1. An Organic Light Emitting Diode (OLED) display substrate comprising a base substrate with a display region arranged thereon, wherein first, second and third sub-pixels for respectively displaying different colors are arranged in the display region;

wherein a first electrode layer, a pixel defining layer, a second electrode layer, and organic functional layers between the first and second electrode layers are arranged in the display region; wherein the first electrode layer comprises a plurality of first electrodes respectively arranged in the first, second and third sub-pixels; the pixel defining layer is arranged on the first electrode layer and is provided with first, second and third openings for respectively defining the first, second and third sub-pixels; surfaces of the first electrodes of the sub-pixels respectively defined by the first, second and third openings towards the second electrode layer are exposed from the first, second and third openings;

wherein the organic functional layers comprise first, second, and third light-emitting layers; the first light-emitting layer covers the display region and is an integral structure, and the second and third light-emitting layers are arranged on a side of the first light-emitting layer towards the second electrode layer;

wherein the second light-emitting layer comprises a plurality of second sub light-emitting layers; an orthographic projection of the second sub light-emitting layers on the base substrate completely covers an orthographic projection of the second opening on the base substrate, and does not overlap with orthographic projections of the first and third openings on the base substrate;

wherein the third light-emitting layer comprises a plurality of third sub light-emitting layers; an orthographic projection of the third sub light-emitting layers on the base substrate completely covers an orthographic projection of the third opening on the base substrate, and does not overlap with orthographic projections of the first and second openings on the base substrate;

wherein the organic functional layers further comprise any one or more of the following film layers arranged between the first and second light-emitting layers: a second blocking layer and a second hole injection layer; wherein the second blocking layer is configured to block outward migration of excitons in the second light-emitting layer;

wherein an orthographic projection of the film layers arranged between the first and second light-emitting layers on the base substrate completely covers the orthographic projection of the second opening on the base substrate, and does not overlap with the orthographic projections of the first and third openings on the base substrate;

wherein the film layers arranged between the first and second light-emitting layers comprise the second hole injection layer and the second blocking layer sequentially stacked in a direction from the first light-emitting layer to the second light-emitting layer; wherein the second hole injection layer is arranged on a surface of the first light-emitting layer facing away from the base substrate, and the second light-emitting layer is arranged on a surface of the second blocking layer facing away from the base substrate; and wherein a highest occupied molecular orbital energy level of a host material of the second hole injection layer is 0-0.5 eV higher than that of a host material of the first light-emitting layer; or wherein materials of the second hole injection layer comprise a host material and a p-type dopant material; and wherein material of the second blocking layer is the same as the host material of the second hole injection layer.

2. The OLED display substrate of claim 1, wherein the second light-emitting layer is not in direct contact with the first light-emitting layer, and the third light-emitting layer is not in direct contact with the first light-emitting layer.

3. The OLED display substrate of claim 1, wherein the number of the organic functional layers in the first sub-pixel is less than that of the organic functional layers in the second sub-pixel, and less than that of the organic functional layers in the third sub-pixel.

4. The OLED display substrate of claim 1, wherein all of film layers on a side of the first electrode exposed by the first opening and facing away from the base substrate cover the display region and each is an integral structure.

5. The OLED display substrate of claim 1, wherein the first light-emitting layer is a red light-emitting layer, the second light-emitting layer is a green light-emitting layer, and the third light-emitting layer is a blue light-emitting layer.

6. The OLED display substrate of claim 1, wherein the organic functional layers further comprise any one or more of the following film layers arranged between the first electrode layer and the first light-emitting layer and covering the display region and each being an integral structure: a first hole injection layer, a first hole transport layer and a first blocking layer; and wherein the first blocking layer is configured to block outward migration of excitons in the first light-emitting layer.

7. The OLED display substrate of claim 6, wherein the film layers arranged between the first electrode layer and the first light-emitting layer and covering the display region and each being an integral structure comprise the first hole injection layer, the first hole transport layer and the first blocking layer sequentially stacked in a direction from the first electrode layer to the first light-emitting layer; wherein the first hole injection layer is arranged on a surface of the first electrode layer facing away from the base substrate, and the first light-emitting layer is arranged on a surface of the first blocking layer facing away from the base substrate;

wherein a highest occupied molecular orbital energy level of a host material of the first blocking layer is 0-0.3 eV higher than that of a host material of the first hole transport layer; or wherein a highest occupied molecular orbital energy level of a host material of the first hole transport layer is −5.2 eV to −5.6 eV.

8. The OLED display substrate of claim 1, wherein the film layers arranged between the first and second light-emitting layers comprise the second blocking layer arranged on a surface of the first light-emitting layer facing away from the base substrate; and
wherein a highest occupied molecular orbital energy level of a host material of the second blocking layer is 0-0.3 eV higher than that of a host material of the first light-emitting layer.

9. The OLED display substrate of claim 1, wherein the organic functional layers further comprise any one or more of the following film layers arranged between the first and third light-emitting layers: a third blocking layer, a third hole transport layer, and a third hole injection layer; wherein the third blocking layer is configured to block outward migration of excitons in the third light-emitting layer; and
wherein an orthographic projection of the film layers arranged between the first and third light-emitting layers on the base substrate completely covers the orthographic projection of the third opening on the base substrate, and does not overlap with the orthographic projections of the first and second openings on the base substrate.

10. The OLED display substrate of claim 9, wherein the film layers arranged between the first and third light-emitting layers comprise the third hole injection layer, the third hole transport layer and the third blocking layer sequentially stacked in a direction from the first light-emitting layer to the third light-emitting layer; wherein the third hole injection layer is arranged on a surface of the first light-emitting layer facing away from the base substrate, and the third light-emitting layer is arranged on a surface of the third blocking layer facing away from the base substrate;
wherein a highest occupied molecular orbital energy level of a host material of the third hole injection layer is 0-0.5 eV higher than that of a host material of the first light-emitting layer; or wherein materials of the third hole injection layer comprise a host material and a p-type dopant material.

11. The OLED display substrate of claim 9, wherein the film layers arranged between the first and third light-emitting layers comprise the third hole transport layer and the third blocking layer sequentially stacked in a direction from the first light-emitting layer to the third light-emitting layer; wherein the third hole transport layer is arranged on a surface of the first light-emitting layer facing away from the base substrate, and the third light-emitting layer is arranged on a surface of the third blocking layer facing away from the base substrate.

12. The OLED display substrate of claim 11, wherein a highest occupied molecular orbital energy level of a host material of the third hole transport layer is 0-0.3 eV higher than that of a host material of the first light-emitting layer.

13. The OLED display substrate of claim 10, wherein a highest occupied molecular orbital energy level of a host material of the third blocking layer is 0-0.3 eV higher than that of a host material of the third hole transport layer.

14. The OLED display substrate of claim 1, wherein the organic functional layers further comprise the following film layers arranged on a side of the first, second and third light-emitting layers towards the second electrode layer and covering the display region and each being an integral structure: a hole blocking layer, an electron transport layer and an electron injection layer;
wherein the film layers arranged on a side of the first, second and third light-emitting layers towards the second electrode layer and covering the display region and each being an integral structure comprise: the hole blocking layer, the electron transport layer and the electron injection layer sequentially stacked in a direction from the first, second and third light-emitting layers to the second electrode layer;
wherein the hole blocking layer is arranged on a surface of a portion of the first light-emitting layer corresponding to the first opening that faces away from the base substrate, and on surfaces of the second and third light-emitting layers facing away from the base substrate; and wherein the second electrode layer is arranged on a surface of the electron injection layer facing away from the base substrate;
wherein a lowest unoccupied molecular orbital energy level of a host material of the hole blocking layer is 0-0.5 eV higher than that of a host material of the second light-emitting layer.

15. The OLED display substrate of claim 14, wherein an electron mobility of the electron transport layer is no less than $1\times10^{-6}$ cm$^2$/Vs; or
wherein a hole mobility of a host material of the first light-emitting layer is no less than $1\times10^{-6}$ cm$^2$/Vs.

16. A display apparatus comprising the OLED display substrate of claim 1.

* * * * *